(12) United States Patent
Kanegae et al.

(10) Patent No.: US 7,180,143 B2
(45) Date of Patent: Feb. 20, 2007

(54) SEMICONDUCTOR DEVICE HAVING A GATE INSULATING LAYER BEING MAINLY MADE OF SILICON OXYNITRIDE (SION) HAVING A COMPRESSION STRAIN STATE AS ITS STRAIN STATE

(75) Inventors: Yoshiharu Kanegae, Chiyoda (JP); Tomio Iwasaki, Tsukuba (JP); Hiroshi Moriya, Chiyoda (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/910,574

(22) Filed: Aug. 4, 2004

(65) Prior Publication Data
US 2005/0051855 A1 Mar. 10, 2005

(30) Foreign Application Priority Data
Sep. 4, 2003 (JP) ............................. 2003-312077

(51) Int. Cl.
*H01L 29/94* (2006.01)
(52) U.S. Cl. ...................... 257/410; 257/288; 257/368; 257/411
(58) Field of Classification Search ................ 257/288, 257/368, 410, 411
See application file for complete search history.

(56) References Cited

U.S. PATENT DOCUMENTS

| 6,548,370 B1* | 4/2003 | Kasahara et al. ............ 257/419 |
| 6,614,064 B1* | 9/2003 | Besser et al. ................ 257/213 |
| 2002/0093046 A1* | 7/2002 | Moriya et al. ............... 257/315 |

FOREIGN PATENT DOCUMENTS

| JP | 2000-58831 | 2/2000 |
| JP | 2002-246591 | 8/2002 |

OTHER PUBLICATIONS

Shin-ichi Takagi, et al., "A New I-V Model for Stress-Induced Leakage Current Including Tunneling," IEEE Transactions on Electron Devices vol 46 No. 2 Feb. 1999.

* cited by examiner

*Primary Examiner*—Nathan J. Flynn
*Assistant Examiner*—Tan Tran
(74) *Attorney, Agent, or Firm*—Antonelli, Terry, Stout, and Kraus, LLP.

(57) ABSTRACT

A semiconductor device constitutes an electric field effect type transistor having a semiconductor substrate, a gate insulating layer formed on the substrate and a gate electrode formed on the gate insulating layer. The gate insulating layer is mainly formed of silicon oxynitride (SiON) and a strain state of the gate insulating layer is a compressed strain state.

8 Claims, 9 Drawing Sheets

SEMICONDUCTOR DEVICE HAVING A GATE INSULATING LAYER BEING MAINLY MADE OF SILICON OXYNITRIDE (SION) HAVING A COMPRESSION STRAIN STATE AS ITS STRAIN STATE

BACKGROUND OF THE INVENTION

The present invention relates to a semiconductor device.

Silicon dioxide ($SiO_2$) has excellent insulation properties having a band gap as large as 8 to 9 eV and is often used as material for gate insulating layers, inter-layer insulating layers or the like in a semiconductor device.

However, recently, gate insulating layers are required to be thinned due to miniaturization of semiconductor devices and oxide layers having the thickness of 3.0 nm or less are used. When the thickness of the oxide layers is thinned to 3.0 nm or less, there is a problem that a tunnel current is increased as it cannot be disregarded, so that a leakage current is increased to thereby increase the power consumption.

It is known that the tunnel current is mainly divided into a Fowler-Nordheim tunnel current (FN current) and a direct tunnel current (DT current). The FN current is the current flowing by causing electrons to tunnel the triangle potential generated by bending the energy barrier by an external electric field. The DT current is the current flowing by causing electrons to tunnel an insulating layer directly. The current having a problem in the thinned silicon dioxide ($SiO_2$) is the DT current.

It is considered that material named high-dielectric constant (high-k) material having the dielectric constant higher than that of the silicon dioxide ($SiO_2$) such as, for example, zirconium dioxide ($ZrO_2$), hafnium dioxide ($HfO_2$), titanium dioxide ($TiO_2$) or the like having the relative dielectric constant of about 25 is used for the gate insulating layer to thereby thicken the thickness of the gate insulating layer and suppress increase of the leakage current while maintaining the dielectric properties. The relative dielectric constant of the silicon dioxide is about 3.9 and accordingly the thickness of the high-dielectric constant insulating layer, that is, the high-k insulating layer having the same dielectric properties as the silicon dioxide having the thickness of 2 nm, for example, is about 12.8 nm when the relative dielectric constant of the high-k insulating layer is equal to 25. The high-k thin film layer having the thickness of 12.8 nm is equivalent to the silicon oxide having the thickness of 2 nm that is named equivalent oxide thickness. The actual thickness of 12.8 nm is named the physical thickness.

In this connection, it is confirmed that a leakage current induced by the mechanical stress in the semiconductor device. Japanese Patent Publication JP-A-2002-246591 discloses that the leakage current is increased depending on the manufacturing method of gate electrodes or gate insulating layers when the high-k material is used for the gate insulating layer.

BRIEF SUMMARY OF THE INVENTION

However, there are various problems when the high-dielectric constant material is used as the gate insulating layer. One of the problems is increase of fixed electrical charges in the layer and reduction of the mobility in the inversion layer. Further, a silicon substrate is oxidized at the interface so that the $SiO_2$ layer is formed and it is difficult to maintain the dielectric properties of the high-k material sufficiently. In addition, since the high-k material is metallic oxide, the deposition method such as sputtering and CVD is used when the high-k material is used for the gate insulating layer and further since the thermal stability is lacking in the high-k material and the aligned of the high-k material with the normal silicon process is not good, it is necessary to reconsider the semiconductor process as compared with the case where $SiO_2$ is used.

Accordingly, silicon oxynitride (SiON) is studied as the gate insulating layer in the current forefront device. It is considered that the relative dielectric constant of the SiON layer is larger (about 6.0) than that of $SiO_2$ although it is not larger than the high-k layer and the compatibility of the SiON layer with the silicon substrate is better than the high-k layer. Further, there is also reported a SiON layer manufacturing method which can be very satisfactorily matched with a conventional semiconductor process and can control the concentration and the distribution of nitrogen. It is reported that the SiON gate insulating layer having the equivalent oxide thickness of 1.5 nm manufactured by the SiON layer manufacturing method can be used to thereby reduce the leakage current by two digits as compared with $SiO_2$. When the high-k material is not mass-produced, how this material is treated skillfully is a problem.

The Japanese Patent Publication JP-A-2002-246591 discloses that the leakage current is increased depending on the manufacturing method of the gate electrodes or the gate insulating layers when the high-k material is used for the gate insulating layer, while this reason is that the high-k gate insulating layer is in the tensile strain state depending on the layer forming method of the gate electrodes or the gate insulating layers to thereby reduce the band gap of the high-k layer so that the tunneling probability of electrons is increased and the leakage current is increased. Since the behavior in change of the electrical characteristics of the device due to the mechanical stress depends on the material forming the device, it is important to analyze the strain dependency of the band gap of SiON and control the strain on the basis of the result of the analyzation for the purpose of the high reliability of MOS transistors using the SiON gate insulating layer.

Further, a tunnel insulating layer of a non-volatile memory is also required to be thinned due to miniaturization of the semiconductor device. $SiO_2$ is heretofore used for the tunnel insulating layer of the non-volatile memory, although when the thinning of the layer is advanced, electrons stored in a floating gate are lost as DT leakage current from the tunnel insulating layer, so that the memory function is lost. For example, in a flash memory which is one of non-volatile semiconductor memories, when conventional silicon dioxide ($SiO_2$) is used as the tunnel insulating layer, for example, the leakage current in the $SiO_2$ tunnel insulating layer in which data is stored must be suppressed to $10^{-10}$ $A/cm^2$ or less in order to store data in the floating gate for a long time such as about 10 years. It is considered that a voltage applied to the tunnel insulating layer during storing or reading of data is about 3 volts and in this case in order to suppress the leakage current to $10^{-15}$ $A/cm^2$ or less, the thickness of $SiO_2$ is required to be 6 nm or more (JP-A-2000-58831). Further, it is considered that a power supply voltage is reduced to thereby decrease the leakage current, although the leakage current caused by the thinning of the $SiO_2$ tunnel insulating layer is under the control of DT current as compared with FN current caused by an external electric field and accordingly when the thinning of the $SiO_2$ tunnel insulating layer is advanced, there is not so much effect on reduction of the leakage current even if the power supply voltage is reduced.

Accordingly, it is an object of the present invention to provide a semiconductor device in which at least one of the above problems is improved.

The present invention solves the above problems by provision of the following configuration. For example, in a semiconductor device including a plurality of MOS transistors having SiON gate insulating layers, the semiconductor device suppresses the leakage current flowing through the gate insulating layer sufficiently. There is provided a semiconductor memory device in which the thickness of a tunnel insulating layer is sufficiently thin for the purpose of the high-speed operation and the memory function is preserved.

The band gap is not so changed by compressed strain and is reduced by tensile strain in $SiO_2$. For high-k material of $ZrO_2$, $HfO_2$ and $TiO_2$, the band gap is reduced by tensile strain and increased by compressed strain. For SiON, the band gap is increased by compressed strain and reduced by tensile strain by study using the first principle calculation of the inventor, while it is understood that a rate of change thereof is larger than the high-k material and it is considered that it is more effective and important than other material for insulating layer to control the electrical characteristics by strain. Further, it is understood that a leakage current flowing through gate insulating layer is also increased by tensile strain and reduced by compressed strain.

An electric field effect type transistor including a semiconductor substrate, a gate insulating layer formed on the substrate and a gate electrode formed on the gate insulating layer is formed and the gate insulating layer is mainly made of silicon oxynitride (SiON) and has a compressed strain state as its strain state.

Since the gate insulating layer is made of SiON and a strain state of the gate insulating layer is mainly a compressed strain state, the band gap can be prevented from being reduced to thereby suppress an FN tunnel current to be low.

Further, in the manufacturing method of the semiconductor device, the gate electrode is made to a tensile strain state and as a result of its reaction the gate insulating layer is made to a compressed strain state, so that the device in which the strain state of the gate insulating layer is the compressed strain state and the strain state of the gate electrode is the tensile strain state is formed.

Alternatively, a plurality of MOS transistors having gate insulating layer are provided. A first MOS transistor includes a gate insulating layer which is mainly made of SiON and a second MOS transistor includes a gate insulating layer which contains lots of silicon oxide. For example, it is preferable that the gate insulating layer of the second MOS transistor is mainly made of silicon oxide.

Further, in the semiconductor device, the first MOS transistor is used for calculation or memory and the second MOS transistor is used for I/O.

Furthermore, in the non-volatile semiconductor memory device including a semiconductor substrate, a tunnel gate insulating layer formed on the substrate, a floating gate formed on the tunnel gate insulating layer, an inter-gate insulating layer formed on the floating gate and a control gate formed on the inter-gate insulating layer, the tunnel gate insulating layer is made of SiON and the tunnel gate insulating layer is mainly in the compressed strain state. Consequently, the thickness of the tunnel gate insulating layer is sufficiently thin and memory function is preserved.

In the manufacturing method of the non-volatile semiconductor memory device, the floating gate is made to the tensile strain state and as a result of its reaction the tunnel gate insulating layer is made to the compressed strain state.

Alternatively, in the non-volatile semiconductor memory device including a semiconductor substrate, a tunnel gate insulating layer formed on the substrate, a floating gate formed on the tunnel gate insulating layer, an inter-gate insulating layer formed on the floating gate and a control gate formed on the inter-gate insulating layer, the floating gate is made of SiN or SiON and is in the strain state.

Alternatively, in the non-volatile semiconductor memory device including a semiconductor substrate, a tunnel gate insulating layer formed on the substrate, a floating gate formed on the tunnel gate insulating layer, an inter-gate insulating layer formed on the floating gate and a control gate formed on the inter-gate insulating layer, the floating gate is made of SiN or SiON and the tunnel gate insulating layer or the inter-gate insulating layer is made of SiON. The floating gate is in the tensile strain state and the tunnel gate insulating layer and the inter-gate insulating layer are in the compressed strain state.

Further, a semiconductor substrate, a tunnel gate insulating layer formed on the substrate, a floating gate formed on the tunnel gate insulating layer, an inter-gate insulating layer formed on the floating gate, a multi-layer film having a memory gate formed on the inter-gate insulating layer, a control gate formed on the tunnel gate insulating layer and a gate insulating layer formed between the multi-layer film and the control gate are provided and the tunnel gate insulating layer is made of SiON and is mainly in the compressed strain state.

Consequently, the thickness of the tunnel gate insulating layer is sufficiently thin and the memory function is preserved to thereby achieve the second object.

Further, in the manufacturing method of the non-volatile semiconductor memory device, the floating gate is made to the tensile strain state and as a result of its reaction the tunnel gate insulating layer is made to the compressed strain state.

Alternatively, in the non-volatile semiconductor memory device including a semiconductor substrate, a tunnel gate insulating layer formed on the substrate, a floating gate formed on the tunnel gate insulating layer, an inter-gate insulating layer formed on the floating gate, a memory gate formed on the inter-gate insulating layer, a gate insulating layer formed to cover the above-mentioned multi-layer and a control gate formed on the gate insulating layer, the floating gate is made of SiN or SiON and is in the strain state.

Alternatively, in the non-volatile semiconductor memory device including a semiconductor substrate, a tunnel gate insulating layer formed on the substrate, a floating gate formed on the tunnel gate insulating layer, an inter-gate insulating layer formed on the floating gate, a memory gate formed on the inter-gate insulating layer, a gate insulating layer formed to cover the above-mentioned multi-layer and a control gate formed on the gate insulating layer, the floating gate is made of SiN or SiON and the tunnel gate insulating layer or the inter-gate insulating layer is made of SiON. The floating gate is in the tensile strain state and the tunnel gate insulating layer and the inter-gate insulating layer are in the compressed strain state.

Further, in a system LSI having a plurality of transistors for logical circuits, memories or the like mixed therein, gate insulating layers of the transistors are made of SiON and the strain state of the SiON is controlled while considering a permissible value of a leakage current of the transistors.

Further, the area in the compressed strain state contains an area in the compressed strain state when the gate electrode is viewed in the direction that source and drain are traversed. It is preferable that the greater part of area is in the compressed strain state.

Moreover, the term of mainly making of or being mainly made of means the component including most atomic percent.

According to the present invention, the gate insulating layer made of SiON is in the compressed strain state and the band gap of the gate insulating layer is larger as compared with the case of the strainless state or the tensile strain state, so that there can be provided the semiconductor device provided with the gate insulating layer structure having the satisfactory characteristics that the probability that electrons penetrate the gate insulating layer in the MOS transistor can be made small, increase of the FN leakage current can be suppressed and the leakage current is difficult to flow.

Further, SiON is used for the tunnel insulating layer of the non-volatile semiconductor memory to make the tunnel insulating layer to the compressed strain state, so that the non-volatile semiconductor memory device can be provided in which the thickness of the $SiO_2$ tunnel insulating layer is made thinner than a lower limit thereof and the memory function is preserved.

In addition, the SiON insulating layer can be made to the compressed strain state to thereby provide the semiconductor device having high-speed operation, high reliability and high yield.

According to the present invention, the problems in the prior art can be solved and the semiconductor device having satisfactory characteristics can be provided. For example, there can be provided the semiconductor device in which the leakage current flowing through the gate insulating layer is suppressed sufficiently.

Other objects, features and advantages of the invention will become apparent from the following description of the embodiments of the invention taken in conjunction with the accompanying drawings.

DETAILED DESCRIPTION OF THE INVENTION

Embodiments of the present invention are now described in detail with reference to FIGS. 1 to 13. The present invention is not limited to the contents disclosed in the specification and the claims and it is impeded that concrete aspect or configuration of the present invention is changed or modified on the basis of known technique. Further, even in the following description, matters described as concrete examples in the following embodiments can be regarded as description of other examples contained in the present invention.

(Embodiment 1)

Figure 1:
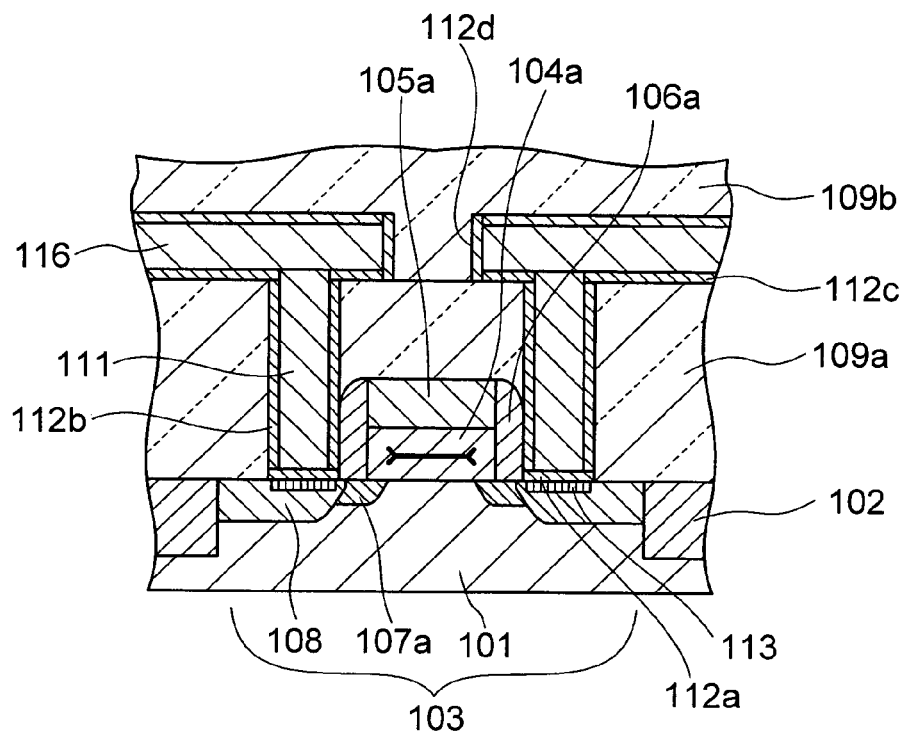
FIG. 1 is a sectional view showing a main portion of a semiconductor device according to a first embodiment of the present invention and taken along A–A' of FIG. 2.
Figure 2:
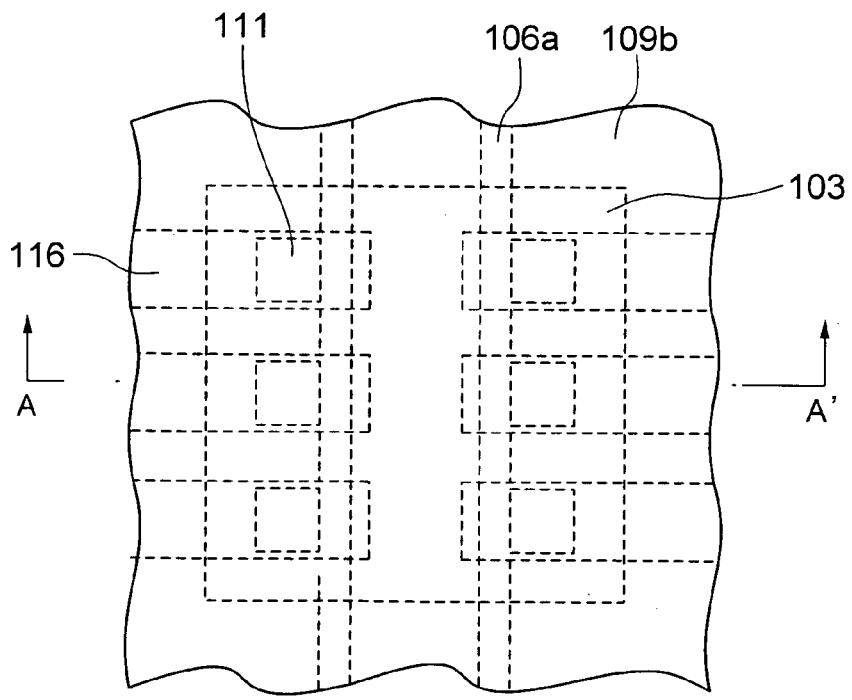
FIG. 2 is a plan view showing the main portion of the semiconductor device according to the first embodiment of the present invention.

A sectional structure of a main portion of a semiconductor device according to a first embodiment of the present invention is shown in FIG. 1, which is a sectional view taken along A–A' in an example of a layout in a plan view shown in FIG. 2. The semiconductor device of the embodiment includes, as shown in FIG. 1, a device separation layer 102 of silicon oxide layer formed in the surface of a P-type silicon substrate 101 and a device formation area 103. The embodiment shows the semiconductor device having an electric field effect type transistor by way of example. An N-channel MOS (NMOS) transistor is formed in the device formation area 103.

The MOS transistor includes a gate insulating layer 104a and a gate electrode 105a. A side wall 106a of silicon oxide, for example, is formed on the side of the gate electrode 105a. The gate insulating layer 104a is made of SiON. The gate electrode 105a is, for example, polycrystalline silicon layer, metal thin film layer, metal silicide layer or laminated structure thereof. Particularly, when it is considered that the mutual diffusion at the interface between the gate electrode and the SiON is suppressed and the resistance of the gate electrode is reduced for the purpose of the high-speed operation, it is preferable that thin barrier metal such as titanium nitride (TiN) and tantalum nitride (TaN) having good adhesive characteristic to the SiON is formed on the SiON layer and metal thin film layer of tungsten (W), molybdenum (Mo), tantalum (Ta), titanium (Ti) or the like is formed on the thin barrier metal. In this case, when it is considered that the reduction of the resistance is important, tungsten (W) or molybdenum (Mo) is used. Further, in this either case, the tungsten (W) is excellent in the thermal stability at a high melting point and the molybdenum (Mo) is excellent in the flatness of the layer. Moreover, when the adhesive characteristic to the barrier metal is regarded as important, titanium nitride (TiN) is formed on the SiON and titanium (Ti) is formed thereon or tantalum nitride (TaN) is formed on the SiON and tantalum (Ta) is formed thereon. Further, in this either case, the structure using the titanium nitride (TiN) and the titanium (Ti) is more excellent in the adhesive characteristic to the SiON and the structure using the tantalum nitride (TaN) and the tantalum (Ta) is more excellent in the barrier characteristic for diffusion or the like.

Source and drain areas of the MOS transistor include extension areas 107a formed in the self-aligned manner to the gate electrode 105a and contact areas 108 formed in the self-aligned manner to the device separation layer 102 and the gate electrode 105a.

Interlayer insulating layers 109a and 109b are formed in the surface of the semiconductor device. Contact holes reaching the contact area 108 are formed in the interlayer insulating layers 109a and 109b and contact plugs 111 are formed therein. The contact plugs are made of tungsten (W), aluminum (Al), polycrystalline silicon (poly-Si) or the like. However, in order to attain the adhesive characteristic to the interface of the silicon substrate and prevention of the mutual diffusion at the interface, it is preferable that the contact plugs are formed after a contact layer 113 is formed at the interface of the contact area, a barrier metal portion 112a is formed on the contact layer and a barrier metal portion 112b is formed at the interface of the interlayer insulating layers. The contact layer 113 is made of cobalt silicide ($CoSi_2$), titanium silicide ($TiSi_2$) or the like and the barrier metal portions 112a and 112b are made of titanium nitride (TiN), tantalum nitride (TaN) or the like.

A wiring layer 116 is formed on the contact plugs 111, while it is preferable that the wiring layer is formed after barrier metal portions 112c and 112d are formed for the purpose of the adhesive characteristic to the interlayer insulating layers 109a and 109b and prevention of the mutual diffusion. The wiring layer is made of aluminum (Al), copper (Cu) or the like and the barrier metal portions 112c and 112d are made of titanium nitride (TiN), tantalum nitride (TaN) or the like. Only one wiring layer is shown in FIG. 1, although a further wiring layer or a plurality of wiring layers may be formed thereon and viaplugs made of W, Cu, Al or the like may be connected between the wiring layers.

When it is assumed that the relative dielectric constants of SiON and $SiO_2$ are 6.0 and 3.9, respectively, the physical thickness of the SiON gate insulating layer is 4.6 nm for the $SiO_2$ equivalent oxide thickness of 3.0 nm, so that it can be expected that the leakage current due to the tunneling of electrons is reduced as compared with $SiO_2$. Further, the SiON gate insulating layer 104a is in the compression strain state.

Figure 3:
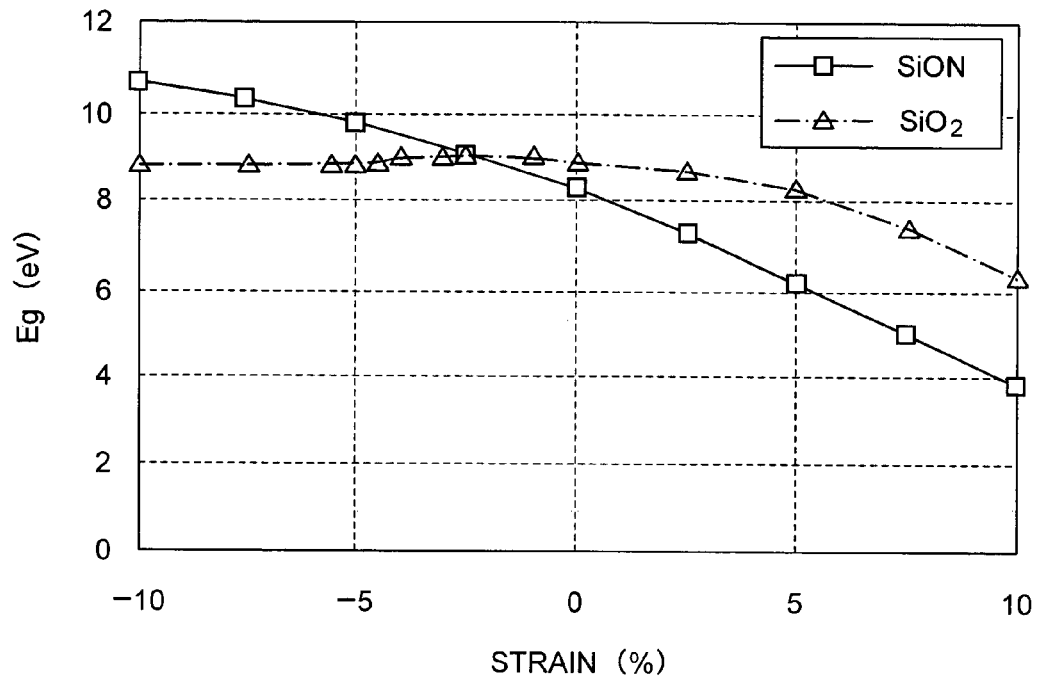
FIG. 3 is a graph showing a strain dependence characteristic of a band gap of an SiON layer (shown by solid line) in the first embodiment of the present invention.

FIG. 3 is a graph showing a strain dependence characteristic of a band gap of SiON (in this graph calculation is made for $Si_2N_2O$ of which the crystal structure is reported) by the first principle calculation. Further, the strain dependence characteristic of the band gap of $SiO_2$ layer is also shown together by dotted line.

Strain is applied in the static water pressure manner. Positive strain represents tensile strain and negative strain represents compression strain. Further, the strain dependence characteristic of the band gap of $SiO_2$ is also shown together. It is known that the magnitude of the band gap by the first principles calculation is reduced to about $2/3$ as compared with experimental values in a lot of substances. However, since there is no report on measurement of the band gap of SiON having the crystal structure of $Si_2N_2O$ up to now, a calculation value (EgcalSiON) of the band gap of SiON is corrected using an experimental value ($EgexSiO_2$) and a calculation value ($EgcalSiO_2$) of the band gap of $SiO_2$ as follows:

$$Eg=EgcalSiON\ EgexSiO_2/EgcalSiO_2, \qquad (1)$$

It is understood from FIG. 3 that when SiON becomes in the compressed strain state, the band gap is increased. Accordingly, it is expected that the SiON gate insulating layer is made to the compressed strain state, so that tunneling of electrons can be suppressed and the leakage current can be reduced. Further, it is considered that the band gap of $SiO_2$ due to strain cannot be almost increased and reduction of the leakage current by controlling the strain cannot be expected.

Figure 4:
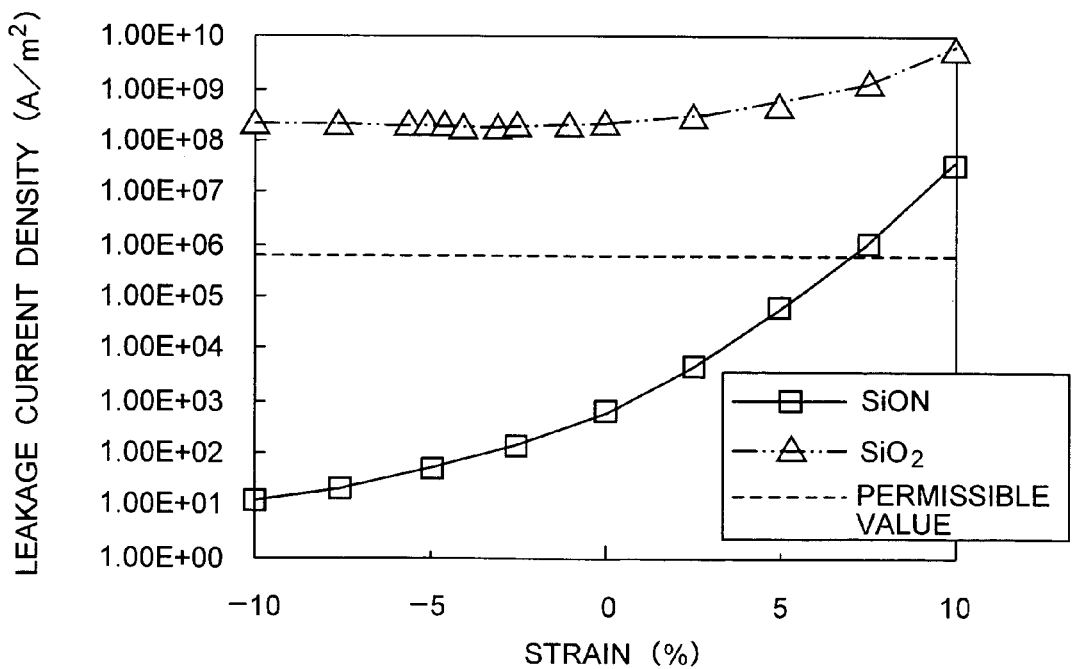
FIG. 4 is a graph showing a strain dependence characteristic of leakage current of SiON gate insulating layer in the first embodiment of the present invention.

FIG. 4 is a graph showing an example of calculation of the strain dependency characteristic of the leakage current density. The calculation is made by using the equation (IEEE TRANSACTIONS ON ELECTRON DEVICES, VOL. 46, No. 2, PP. 348–354) using the WKB (Wentzel-Kramers-Brillouin) approximation. In FIG. 4, the equivalent oxide thickness (TOX) of the gate and the gate voltage (VG) are decided from the requirement value in the international semiconductor technique load map. The applied voltage is 1.1 volts and the equivalent oxide thickness is 1.2 nm. The calculation example of the strain dependence characteristic of the $SiO_2$ layer is also shown together by dotted line. At this time, for the purpose of that the leakage current is not underestimated, though the equivalent oxide thickness has a difference in the described value, this minimum value is used. Though the described value of the gate voltage is a power supply voltage (Vdd), the actual gate voltage is equal to or lower than the power supply voltage. Further since the leakage current is increased as the gate voltage is larger, the calculation is made as VG=Vdd. The calculation of FIG. 4 is made at the node (the year 2002) in case where the half-pitch of the MPU is 130 nm (TOX=1.2 nm, VG=1.1 V) and FIG. 4 shows the calculation result of high-performance (HP) (high-speed operation) transistor. The dotted line in FIG. 4 represents a maximum permissible value of the leakage current. It is understood from this result that the SiON gate insulating layer can be made to the compressed strain state to thereby reduce the leakage current. Further, it is understood that it is already insufficient that the conventional $SiO_2$ layer satisfies the requirement value of the load map and the effect of controlling the strain cannot be much expected in the $SiO_2$ layer. On the other hand, when the SiON layer is used, it is understood that the requirement value is satisfied as long as any extreme tensile strain larger than or equal to 7% is not produced. Currently, the physical limit of the $SiO_2$ layer is actually imminent and application of the SiON layer to the gate insulating layer of the MOS transistor is started. Furthermore, it is understood that the strain state of the SiON layer can be controlled to the compressed strain state to thereby reduce the leakage current and fabricate a high-reliable device. FIG. 4 shows the calculation example of the high-performance transistor such as MPU, although the same effect can be also obtained for low-operating power (LOP) transistors and low-standby power (LSTP) transistor.

Figure 5A:
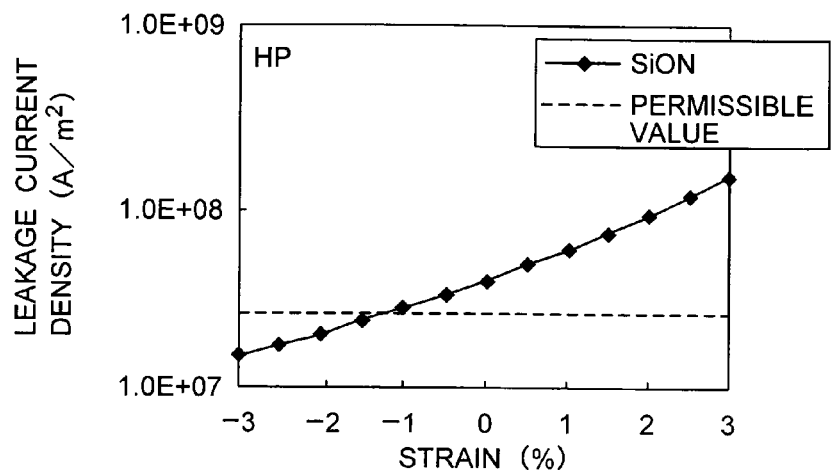
FIGS. 5A to 5C are graphs showing strain dependence characteristics of leakage current of SiON gate insulating layer in the first embodiment of the present invention.
Figure 5B:
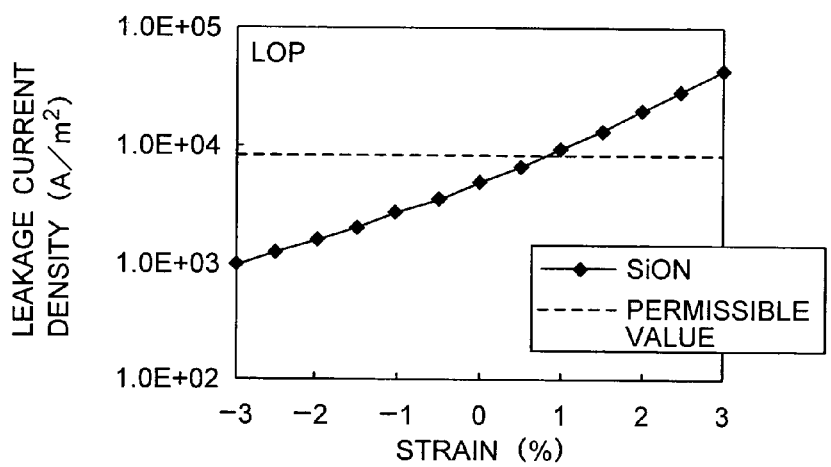
Figure 5C:
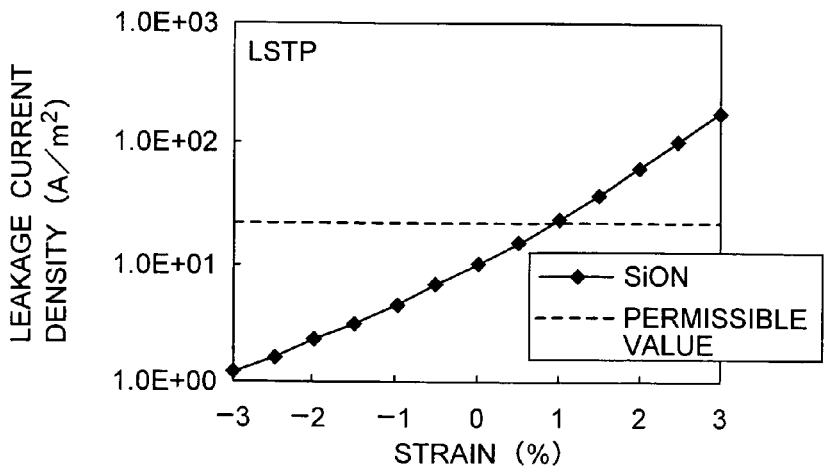

In order to predict the strain state in an actual MOS transistor, analysis using the finite-element method has been made. It is understood from the result of the analysis that the strain at the end of the gate is strongest as compared with the middle portion of the gate and the tensile strain of about 3% is produced at the end of the gate when a metal gate is used to fabricate the MOS transistor without considering control of strain. As a result, it is considered that the actual and controllable strain has the value of this extent. An example of calculation in which the importance of controlling the strain is remarkable is shown in FIGS. 5A to 5C. Parameters of FIGS. 5A to 5C are shown for calculation at the node (the year 2006) in case where the half-pitch of the MPU described in the international semiconductor technique load map is 70 nm and FIG. 5A shows the calculation for the high-performance transistor (HP), FIG. 5B for the low-operating power transistor (LOP) and FIG. 5C for the low-standby power transistor (LSTP) (calculation is made using the layer thickness TOX=0.7 nm and the gate voltage VG=0.9 V for FIG. 5A, TOX=1.1 nm and VG=1.0 V for FIG. 5B and TOX=1.4 nm and VG=1.2 V for FIG. 5C). It is understood from FIGS. 5A to 5C that it is necessary that the compressed strain is preferably made larger than or equal to 1.3% for the high-performance transistor, the tensile strain is preferably made smaller than or equal to 0.7% for the low-operating power transistor and the tensile strain is preferably made smaller than or equal to 0.9% for the low-standby power transistor in order to suppress the leakage current to the permissible value or less represented by the dotted line. Further, the yield of the device can be improved and the life of the SiON layer can be prolonged by controlling the strain as above.

Even if the applied voltage and the layer thickness are other values than those of FIGS. 4 and 5A to 5C, there can be attained the same effects that the leakage current density in SiON is increased as the tensile strain is increased and is reduced as the compressed strain is increased and there can be attained the same effects that the leakage current density of $SiO_2$ is increased as the tensile strain is increased and is less changed even if the compressed strain is increased.

It is understood that the leakage current in the MOS transistor using the SiON gate insulating layer can be reduced as the compressed strain is increased, although when factors except the leakage current are considered, it is not necessarily preferable that the strain is too large.

It is preferable that a measured value of the strain is suppressed to about 1.5% or less when the withstand voltage characteristic is considered, for example. Further, it is preferable that when the peeling strength is considered the lattice strain at the interface is suppressed to about 7% or less and the measured value of the strain is suppressed to about 2% or less.

Accordingly, in the case of the parameters for the calculation of FIGS. 5A to 5C, for example, in addition to suppression of the leakage current to the permissible value or less, it is preferable that the compressed strain is equal to 1.3 to 1.5% for the high-performance transistor, the compressed strain is smaller than or equal to about 1.5% or the tensile strain is smaller than or equal to 0.7% for the low-operating power transistor, and the compressed strain is smaller than or equal to about 1.5% or the tensile strain is smaller than or equal to 0.9% for the low-standby power transistor when the withstandable voltage characteristic and the peeling strength are taken into consideration.

(Embodiment 2)

A second embodiment of the present invention is now described with reference to FIGS. 6A to 6D and FIGS. 7A to 7C. In order to make the gate insulating layer to the compressed strain state, the gate electrode is made to the tensile strain state, for example. The gate electrode is made to the tensile strain state, so that the gate insulating layer disposed under the gate electrode is formed to be made to the compressed strain state as a result of its reaction.

FIGS. 6A to 6D and FIGS. 7A to 7C illustrate the manufacturing method of the semiconductor device including the gate electrode in the tensile strain state and the SiON gate insulating layer in the compressed strain state.

Figure 6A:
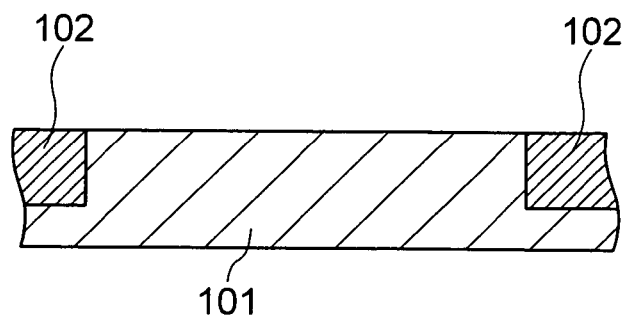
FIGS. 6A to 6D are sectional views showing a main portion of the semiconductor device shown in FIG. 1 so as to explain a manufacturing method thereof.

First, groove having the depth of 200 to 300 nm are formed in the surface of a P-type silicon substrate 101 and silicon oxide layer is embedded therein to form device separation layer 102 of shallow groove type (FIG. 6A).

Figure 6B:
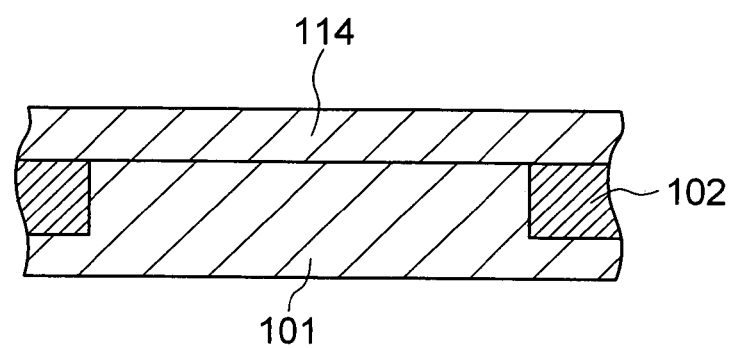

Next, the surface of the silicon substrate 101 is thermally oxidized at temperature of about 800 to 850° C. At this time, $NH_3$ or the like is contained therein so that nitrogen is introduced into the oxide layer to form SiON layer 114. Alternatively, gases such as $NH_3$ or $N_2O$ may be used to form SiON by means of the chemical vapor deposition (CVD) method (FIG. 6B).

Figure 6C:
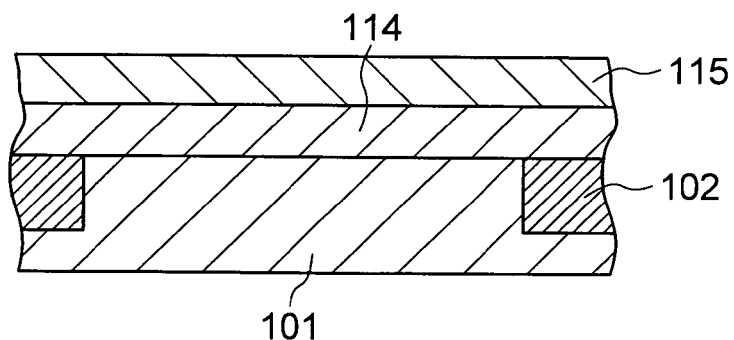

Then, polycrystalline silicon layer 115 containing impurity phosphorus (P) is formed by means of the CVD method or the like. At this time, gas containing carbon atoms (C) or the like as a constituent element is caused to be contained therein so that the impurity such as the carbon atoms is contained in the polycrystalline silicon (FIG. 6C).

Figure 6D:
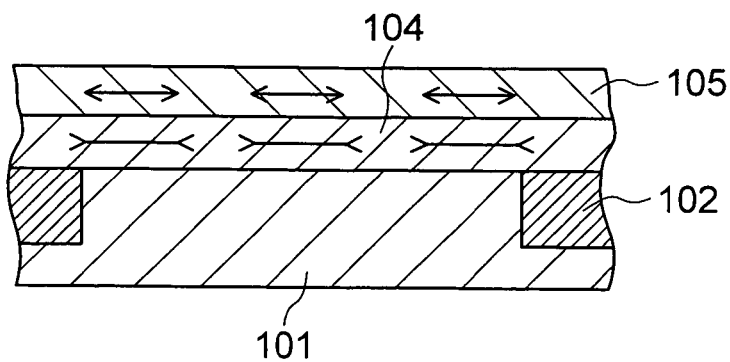

Thereafter, the impurity such as carbon atoms is removed by means of the thermal treatment to thereby contract the volume of the polycrystalline silicon layer 115 so that the polycrystalline silicon layer is made to the tensile strain state (105). As a result of the reaction of the tensile strain, the SiON layer 114 becomes the compressed strain state (104). The degree of the compressed strain can be controlled by the impurity content before the thermal treatment (FIG. 6D).

Next, a photoresist layer is used as a mask to etch the polycrystalline silicon layer 105 and the SiON layer 104, so that a gate insulating layer 104a and the gate electrode 105a of the MOS transistor are formed.

Figure 7A:
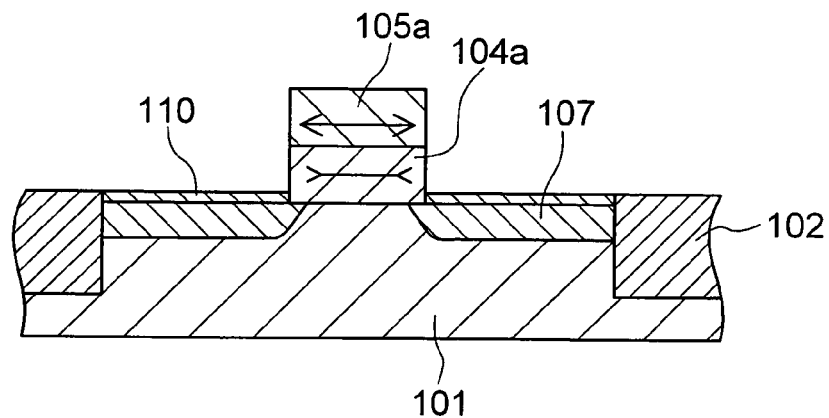
FIGS. 7A to 7C are sectional views showing a main portion of the semiconductor device shown in FIG. 1 so as to explain a manufacturing method thereof.
Figure 7B:
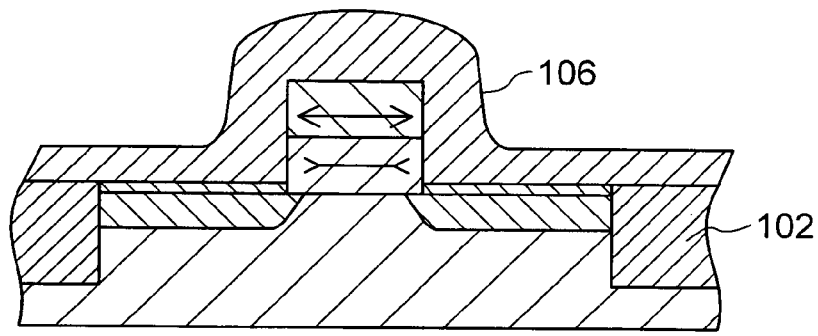

Then, silicon oxide layer 110 having the thickness of about 2 nm is formed by means of the thermal oxidization method or CVD method and thereafter shallow source and drain areas 107 of the MOS transistor are formed by the ion implantation of arsenic (As) or phosphorus (P). This process is to form an extension area for connecting the source and drain areas and a channel portion. The purpose of forming the silicon oxide layer 110 is to mitigate the damage to the silicon substrate by the ion implantation (FIG. 7A).

Figure 7C:
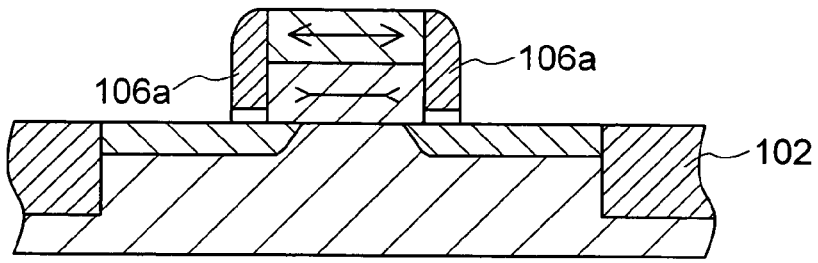

Subsequently, silicon oxide layer 106 having the thickness of about 200 nm is deposited on the surface of the semiconductor substrate by the sputtering method or the CVD method (FIG. 7B) and a side wall 106a is formed on the side wall of the gate electrode and the gate insulating layer by etching the silicon oxide layers 106 and 110 (FIG. 7C).

Next, the device separation layer 102, the gate electrode 105a and the side wall 106a are used as a mask to form source and drain diffusion layers by the ion implantation of phosphorus or arsenic. Thereafter, interlayer insulating layer 109a is formed by means of the CVD method and contact holes reaching the surface of the diffusion layer is formed. Then, cobalt (Co), titanium (Ti) or the like is deposited at an opening portion of the contact hole by means of the sputtering or the like and thermal treatment is made to thereby form a contact layer 113 of $CoSi_2$, $TiSi_2$ or the like in the portion being in contact with Si. Then, after Co, Ti or the like in the portion being in contact with the interlayer insulating layer is removed and barrier metal portions 112a and 112b of TiN, TaN or the like are formed by the sputtering, contact plugs 111 are formed by the sputtering. Thereafter, barrier metal portions 112c and 112d and the wiring layer 116 are formed by the sputtering and interlayer insulating layer 109b is formed by the sputtering or CVD to thereby fabricate the semiconductor device as shown in FIG. 1.

The above manufacturing method is applied to the N-channel MOS transistor, although this manufacturing method can be also applied to P-channel MOS transistors, CMOS transistors and BiCMOS transistors.

Further, the gate electrode 105a is not limited to the polycrystalline silicon layer and may be metal thin film of tungsten, molybdenum or the like, metal compound of tungsten nitride or the like, metal silicide layer of tungsten silicide or the like or laminated structure thereof. Particularly, when it is considered that the mutual diffusion at the interface between the gate electrode and the SiON is suppressed and the resistance of the gate electrode is reduced for the purpose of the high-speed operation, it is preferable that thin barrier metal such as TiN and TaN having good adhesive characteristic to the SiON is formed on the SiON layer and metal thin film layer of W, Mo, Ta, Ti or the like is formed on the thin barrier metal. In this case, when it is considered that the reduction of the resistance is important, W or Mo is used. Further, in this either case, W is excellent in the thermal stability at a high melting point and Mo is excellent in the flatness of the layer. Moreover, when the adhesive characteristic to the barrier metal is regarded as important, TiN is formed on the SiON and Ti is formed thereon or TaN is formed on the SiON and Ta is formed thereon. Further, in this either case, the structure using TiN and Ti is more excellent in the adhesive characteristic to the SiON and the structure using TaN and Ta is more excellent in the barrier characteristic for diffusion or the like.

When the material described above is used as the gate electrode layer, the layer forming condition is controlled to thereby make the gate insulating layer to the compressed strain state. The above metal or metal compound is made to the tensile strain state by depositing it at the layer forming temperature of 300° C. by the sputtering method, for example. When the metal or metal compound layer is used as the gate electrode, the SiON gate insulating layer is made to the compressed strain state as a result of its reaction.

As described above, according to the semiconductor device of the present invention, since the gate insulating layer 104a is constituted of SiON, the physical thickness of the gate insulating layer can be thickened and it can be prevented that the DT current flows as compared with the case where the gate insulating layer is formed of silicon oxide.

Further, the gate insulating layer 104a formed of SiON becomes the compressed strain state and the band gap thereof is made larger as compared with the case of the strainless state or the tensile strain state. Consequently, the probability that electrons penetrate the insulating layer can be made small and increase of the leakage current can be suppressed.

Moreover, to positively avoid the gate insulating layer 104a from being made to the tensile strain state is effective for preventing the leakage current in the gate insulating layer from being increased.

When the gate electrode is made to the tensile strain state to thereby make the gate insulating layer to the compressed strain state, the interface of the silicon substrate also becomes the compressed strain state. As the method of confirming that the SiON gate insulating layer is in the compressed strain state, a transmission electron microscope (TEM) may be used to measure the distance between Si atoms in the silicon substrate at the interface of the SiON insulating layer. If the distance between the atoms is smaller than that in the strainless state, the SiON insulating layer is in the compressed strain state. Alternatively, the stress on the silicon substrate at the interface of the SiON insulating layer may be measured by a stress TEM.

Further, the distance between the Si atoms in the silicon substrate at the interface of the SiON insulating layer may be measured by diffraction of X rays, electron rays or the like.

For example, the measurement is made by projecting a spot or spotlight having a diameter of 20 nm on the gate insulating layer around the position corresponding to an end of the gate electrode. The reason is that there is a case where the end of the gate electrode has the remarkably large strain state as compared with the gate insulating layer at the middle area of the gate electrode.

Measurement can be made-for other embodiments similarly.

(Embodiment 3)

In the embodiment 3, after formation of the SiON layer by the thermal oxidization of the surface of the silicon substrate 101 in the embodiment 2, an amorphous silicon layer 115 containing impurity phosphorus (P) is formed by means of the CVD method or the like.

Thereafter, the temperature of the semiconductor substrate is raised to 600° C. or more so that the amorphous silicon layer 115 is crystallized to be the polycrystalline silicon layer 105. Since the crystallization of the amorphous silicon contracts its volume, the polycrystalline silicon layer 105 formed by the crystallization becomes the tensile strain state. As a result of the reaction of the tensile strain, the SiON gate insulating layer 104 under the polycrystalline silicon layer 105 becomes the compressed strain state (FIG. 6D). The crystallization of the amorphous silicon layer 115 can be made by controlling the temperature of the semiconductor substrate, although it may be made by irradiation of laser.

(Embodiment 4)

In the embodiment 4, the SiON gate insulating layer itself is made to the compressed strain state, although in the embodiments 2 and 3 the gate electrode is made to the tensile strain state and as a result of its reaction the gate insulating layer is made to the compressed strain state. To this end, for example, when the SiON insulating layer is formed, SiON or $SiO_2$ is formed by the thermal oxidization or the CVD method and thereafter thermal treatment is made in $NH_3$ or the plasma nitriding method or the like is used to further introduce nitrogen so that the SiON layer 114 is formed. Consequently, the volume thereof is increased as compared with SiON or $SiO_2$ formed first by the thermal oxidization or CVD and the SiON gate insulating layer itself becomes the compressed strain state. When the SiON gate insulating layer itself becomes the compressed strain state, the interface of the silicon substrate becomes the tensile strain state by the reaction thereof. Further, the strain amount can be controlled by the thermal treatment in $NH_3$ and the process condition upon introduction of nitrogen by the plasma nitriding method.

The high-speed MOS transistors use NMOS in many cases, while the NMOS can be operated at a high speed when a channel portion thereof becomes the tensile strain state. It is considered that the strain in the direction parallel to the channel mainly affects, while in the method of the embodiment the tensile strain is mainly added in the direction parallel to the channel at the interface of the silicon substrate. Accordingly, when the method of the embodiment is used, not only reduction of the leakage current by the compressed strain of the gate insulating layer but also high-speed operation of the transistor by the tensile strain of the channel portion at the interface of the silicon substrate can be realized simultaneously.

In the method of confirming that the SiON gate insulating layer is in the compressed strain state, the distance between silicon atoms of the silicon substrate at the interface of the SiON insulating layer is measured by means of TEM. However, in the embodiment, when the distance between silicon atoms is larger than the strainless state, the SiON insulating layer is in the compressed strain state. Alternatively, the stress on the silicon substrate at the interface of the SiON insulating layer may be measured by a stress TEM or the distance between silicon atoms of the silicon substrate at the interface of the SiON insulating layer may be measured by the diffraction of X rays, electron rays or the like.

(Embodiment 5)

Figure 8:
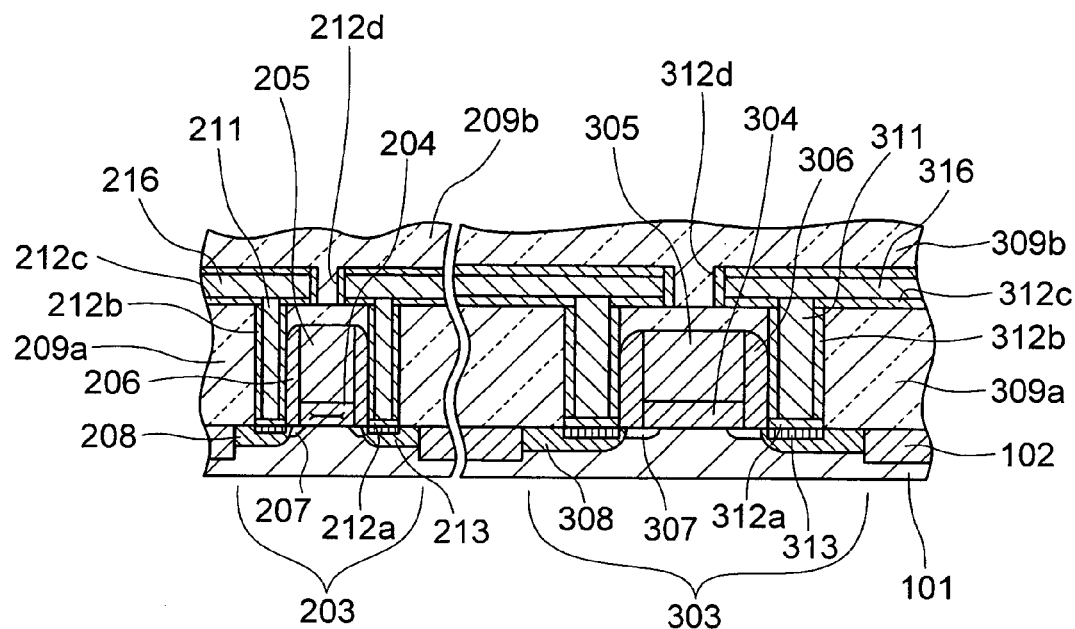
FIG. 8 is a sectional view showing a main portion of a semiconductor device according to a fourth embodiment of the present invention and taken along A–A' of FIG. 9.
Figure 9:
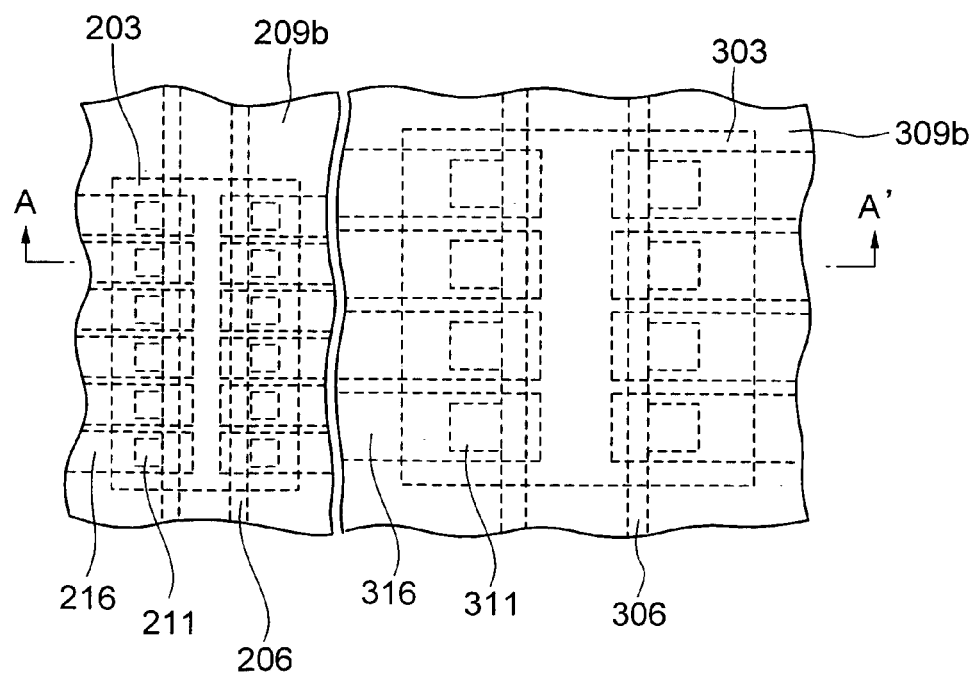
FIG. 9 is a plan view showing the main portion of the semiconductor device according to the fourth embodiment of the present invention.

A sectional structure of a main portion of the semiconductor device according to a fifth embodiment of the present invention is shown in FIG. 8, which is a sectional view taken along A–A' in an example of a layout in a plan view shown in FIG. 9.

The semiconductor device of the present invention includes an I/O circuit which is directly connected to an external apparatus and an internal circuit which is not required to be connected to the external apparatus. The I/O circuit and the internal circuit are formed of single-channel MOS transistors, C-MOS transistors or BiCMOS transistors. In the embodiment, the semiconductor device formed of only N-channel MOS transistors having source and drain diffusion layers of LDD structure is described for simplification of description.

As shown in FIG. 8, the semiconductor device of the embodiment includes a device separation layer 102 of, for example, silicon oxide layer formed in the surface of P-type silicon substrate 101, an internal circuit element formation area 203 and an I/O circuit element formation area 303. First and second N-channel MOS transistors are formed in the internal circuit element formation area 203 and the I/O circuit element formation circuit 303, respectively.

The first MOS transistor formed in the internal circuit element formation area 203 includes a gate insulating layer 204 and a gate electrode 205. A side wall 206 of, for example, silicon oxide is formed on the side of the gate electrode 205. The gate insulating layer 204 is mainly made of SiON and the gate electrode 205 is formd of, for example, polycrystalline silicon layer, metal thin film layer, metal silicide layer or laminated structure thereof. Particularly, when it is considered that the mutual diffusion at the interface between the gate electrode and the SiON is suppressed and the resistance of the gate electrode is reduced for the purpose of the high-speed operation, it is preferable that thin barrier metal such as TiN and TaN having good adhesive characteristic to the SiON is formed on the SiON layer and metal thin film layer of W, Mo, Ta, Ti or the like is formed on the thin barrier metal. In this case, when it is considered that the reduction of the resistance is important, W or Mo is used. Further, in this either case, W is excellent in the thermal stability at a high melting point and Mo is excellent in the flatness of the layer. Moreover, when the adhesive characteristic to the barrier metal is regarded as important, TiN is formed on the SiON and Ti is formed thereon or TaN is formed on the SiON and Ta is formed thereon. Further, in this either case, the structure using TiN and Ti is more excellent in the adhesive characteristic to the SiON and the structure using TaN and Ta is more excellent in the barrier characteristic for diffusion or the like.

The first MOS transistor includes, as source and drain diffusion layers, an extension area 207 formed in the self-aligned manner to the gate electrode 205 and a contact area 208 formed in the self-aligned manner to the device separation layer 102 and the gate electrode 205. The SiON gate insulating layer 204 can thicken the physical thickness of the gate insulating layer and prevent flowing of the DT current as compared with the case of $SiO_2$.

The second MOS transistor formed in the I/O circuit element formation area 303 includes a gate insulating layer 304 and a gate electrode 305. A side wall 306 of, for example, silicon oxide is formed on the side of the gate electrode 305. The gate insulating layer 304 is formed by a lamination of $SiO_2$ or SiON and $SiO_2$ having the thickness of 3 nm or more. The gate electrode 305 is formed by, for example, polycrystalline silicon layer, metal thin film layer, metal silicide layer or laminated structure thereof. Particularly, when the adhesive characteristic to $SiO_2$, suppression of the mutual diffusion at the interface and stability are considered, it is preferable that polycrystalline silicon is used. Further, when not only the stability but also the high-speed operation is desired, it is preferable that polycrystalline silicon is formed on $SiO_2$, thin TiN, TaN or the like is further formed thereon as barrier metal and metal thin film layer of W, Mo, Ta, Ti or the like is still further formed on the thin barrier metal. In this case, when it is considered that the reduction of the resistance is important, W or Mo is used. Further, in this either case, W is excellent in the thermal stability at a high melting point and Mo is excellent in the flatness of the layer. Moreover, when the adhesive characteristic to the barrier metal is regarded as important, TiN is formed on polycrystalline silicon and Ti is formed thereon or TaN is formed on polycrystalline silicon and Ta is formed thereon. Further, in this either case, the structure using TiN and Ti is more excellent in the adhesive characteristic to polycrystalline silicon and the structure using TaN and Ta is more excellent in the barrier characteristic for diffusion or the like.

The second MOS transistor includes, as source and drain diffusion layers, an extension area 307 formed in the self-aligned manner to the gate electrode 305 and a contact area 308 formed in the self-aligned manner to the device separation layer 102 and the gate electrode 305.

Interlayer insulating layers 209a, 209b, 309a and 309b are formed in the surface of the semiconductor device. Contact holes reaching contact areas 208 and 308 of the source and drain diffusion layers are formed in the interlayer insulating layers 209a, 209b, 309a and 309b and contact plugs 211 and 311 are formed in the contact holes. The contact plugs are made of W, Al, polycrystalline silicon (poly-Si) or the like. However, in order to attain the adhesive characteristic to the interface of the silicon substrate and prevention of the mutual diffusion at the interface, it is preferable that the contact plugs are formed after contact layers 213 and 313 are formed at the interface of the contact areas, barrier metal portions 212a and 312a are formed on the contact layers and barrier metal portions 212b and 312b are formed at the interface of the interlayer insulating layers. The contact layers 213 and 313 are made of $CoSi_2$, $TiSi_2$ or the like and the barrier metal portions 212a, 212b, 312a and 312b are made of TiN, TaN or the like.

Wiring layers 216 and 316 are formed on the contact plugs 211 and 311, although it is preferable that the wiring layers are formed after barrier metal portions 212c, 212d, 312c and 312d are formed for the purpose of the adhesive characteristic to the interlayer insulating layers 209a, 209b, 309a and 309b and prevention of the mutual diffusion. The wiring layers are made of Al, Cu or the like and the barrier metal portions 212c, 212d, 312c and 312d are made of TiN, TaN or the like. Only one layer is shown as the wiring layers in FIG. 8, although a further wiring layer or a plurality of wiring layers may be formed thereon and viaplugs made of W, Cu, Al or the like may be connected between the wiring layers.

The first MOS transistor formed in the internal circuit element area uses SiON layer as gate insulating layer in the same manner as the structure of the MOS transistor shown in the embodiment 1 and the length of the gate thereof is as short as 0.1 µm, for example. Accordingly, the first MOS transistor is suitable for the high-speed operation.

Further, the second MOS transistor for the I/O circuit is not required to be operated at a higher speed than the MOS transistor for the internal circuit and accordingly may be formed by conventional $SiO_2$ gate insulating layer or insulating layer constituted of laminated layer of SiON and $SiO_2$. It is understood heretofore that the gate insulating layer containing $SiO_2$ having the thickness of 3 nm or more can suppress both of DT current and FN current to be small, and the semiconductor device with high reliability and high yield can be provided.

The semiconductor device of the embodiment includes the MOS transistor suitable for the high-speed operation as the internal circuit element and the MOS transistor excellent in the reliability as the I/O circuit element, both transistors being formed in the same substrate, and accordingly there can be provided the semiconductor device with high reliability and low manufacturing cost.

Further, it is preferable that the gate insulating layer 204 of SiON is in the compressed strain state. Consequently, as described in the embodiment 1, the band gap of the gate insulating layer can be increased as compared with the case of the strainless state or the tensile strain state, the probability that electrons penetrate the insulating layer can be made small and the leakage current can be reduced. It is preferable that the strain amount of the SiON gate insulating layer is smaller than or equal to about 1.5% as described in the embodiment 1 when the withstandable voltage characteristic and the peeling strength are considered.

(Embodiment 6)

Figure 10:
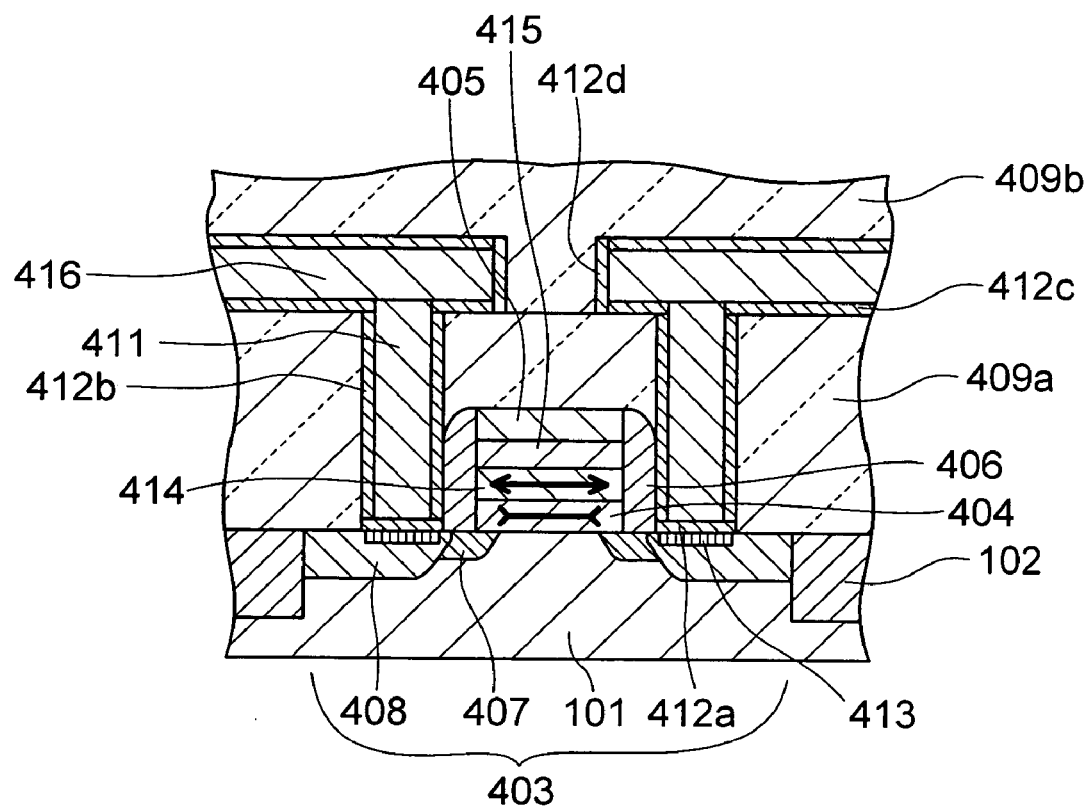
FIG. 10 is a sectional view showing a main portion of a semiconductor memory device according to a fifth embodiment of the present invention.

FIG. 10 is a sectional view of the semiconductor device according to a sixth embodiment of the present invention. The semiconductor device of the embodiment constitutes a non-volatile semiconductor memory device and includes, as shown in FIG. 10, device separation layer 102 of, for example, silicon oxide layer formed in the surface of P-type silicon substrate 101 and device formation area 403. A floating gate type N-channel transistor is formed in the device formation area 403.

The floating gate type transistor of the embodiment is constituted by laminated structure of a tunnel gate insulating layer 404, a floating gate 414, an inter-gate insulating layer 415 and a control gate 405. A side wall 406 made of, for example, silicon oxide is formed on the side of the laminated structure. The tunnel gate insulating layer 404 is mainly made of SiON and the floating gate 414 and the control gate 405 are constituted by polycrystalline silicon layer. The inter-gate insulating layer 415 is made of silicon oxide, silicon nitride, silicon oxynitride or the like. The control gate is constituted by metal thin film layer of tungsten, molybdenum or the like or metal compound of tungsten nitride or the like or metal silicide layer of tungsten silicide or the like or laminated structure thereof.

The floating gate type transistor includes, as source and drain diffusion layers, an extension area 407 formed in the self-aligned manner to the control gate 405 and a contact area 408 formed in the self-aligned manner to the device separation layer 102 and the control gate 405.

Interlayer insulating layers 409a and 409b are formed in the surface of the semiconductor device. Contact holes reaching the contact area 408 are formed in the interlayer insulating layers 409a and 409b and contact plugs 411 are formed therein. The contact plugs are made of W, Al, poly-Si or the like. However, in order to attain the adhesive characteristic to the interface of the silicon substrate and prevention of the mutual diffusion at the interface, it is preferable that the contact plugs are formed after a contact layer 413 is formed at the interface of the contact area, a barrier metal portion 412a is formed on the contact layer and a barrier metal portion 412b is formed at the interface of the interlayer insulating layers. The contact layer 413 is made of $CoSi_2$, $TiSi_2$ or the like and the barrier metal portions 412a and 412b are made of TiN, TaN or the like.

A wiring layer 416 is formed on the contact plugs 411, while it is preferable that the wiring layer is formed after barrier metal portions 412c and 412d are formed for the purpose of the adhesive characteristic to the interlayer insulating layers 409a and 409b and prevention of the mutual diffusion. The wiring layer is made of Al, Cu or the like and the barrier metal portions 412c and 412d are made of TiN, TaN or the like. Only one wiring layer is shown in FIG. 10, although a further wiring layer or a plurality of wiring layers may be formed thereon and viaplugs made of W, Cu, Al or the like may be connected between the wiring layers.

The tunnel gate insulating layer 404 of SiON is in the compressed strain state. As described in the embodiment 1, since the SiON layer is made to the compressed strain state to thereby increase the band gap, it can be expected that the FN leakage current flowing through the tunnel insulating layer is suppressed. Accordingly, the SiON layer is used as the tunnel insulating layer of the non-volatile semiconductor memory device and is made to the compressed strain state, so that there can be provided the non-volatile semiconductor memory device having the equivalent oxide thickness thinner than or equal to the lower limit of the $SiO_2$ tunnel insulating layer and the memory function preserved. Further, it is preferable that the strain amount of the SiON tunnel gate insulating layer is smaller than or equal to about 1.5% as described in the embodiment 1 when the withstandable voltage characteristic and the peeling strength are taken into consideration.

The floating gate or the control gate over the SiON tunnel gate insulating layer is made to the tensile strain state to thereby make the SiON tunnel gate insulating layer to the compressed strain state as a result of its reaction. Further, in order to make the floating gate or control gate to the tensile strain state, the method of forming the gate electrode being in the tensile strain state described in the embodiment 2 or 3 may be applied upon formation of the floating gate or control gate. Alternatively, the method described in the embodiment 4 may be used to make the SiON tunnel gate insulating layer itself to the compressed strain state. In this case, since the channel portion at the interface of the silicon substrate is made to the tensile strain state, not only reduction of the leakage current by the compressed strain of the tunnel gate insulating layer but also high-speed operation of the transistor by the tensile strain of the channel portion at the interface of the silicon substrate can be realized simultaneously for the N-channel transistor.

(Embodiment 7)

The embodiment 7 uses silicon nitride or silicon oxynitride as the floating gate 414 in the embodiment 6. It is known that the silicon nitride and the silicon oxynitride have the property of storing electrons in lattice defects. Generally, it is considered that since the binding energy between atoms becomes smaller when the crystal lattice is distorted, the lattice defects is prone to be produced. Accordingly, in the non-volatile semiconductor memory device including the laminated structure of the tunnel gate insulating layer 404, the floating gate 414, the inter-gate insulating layer 415 and the control gate 405, silicon nitride or silicon oxynitride silicon is used as constituent material of the floating gate and the floating gate is made to the strain state, so that it is expected that the non-volatile semiconductor memory device having high storage effect of electrons and small leakage current as compared with the strainless state is attained. Further, it is preferable that the strain amount of the floating gate is smaller than or equal to about 2% when the peeling strength is taken into consideration.

Further, the floating gate is made to the tensile strain state to thereby make the tunnel gate insulating layer under the floating gate and the inter-gate insulating layer on the floating gate are both made to the compressed strain state as a result of its reaction. Accordingly, when the tunnel gate insulating layer or the inter-gate insulating layer is not required to be thinned, conventional silicon oxide may be used as constituent material of these insulating layers, while when thinning is required, the relative dielectric constant is larger than $SiO_2$ and accordingly the equivalent oxide thickness is thicker than or equal to the physical thickness and the DT leakage current can be reduced. In addition, the band gap is increased in the compressed strain state and SiON layer which can also reduce the FN leakage current is used in the tunnel gate insulating layer or the inter-gate insulating layer to thereby attain the non-volatile semiconductor memory device with higher reliability.

Further, in order to make the floating gate made of silicon nitride or silicon oxynitride to the tensile strain state, gas containing carbon atoms (C) as constituent element is caused to be contained upon formation of layer to thereby cause impurity such as carbon atoms to be contained into the floating gate. Thereafter, the impurity such as carbon atoms is removed by thermal treatment, so that the volume of the floating gate is contracted to thereby be the tensile strain state.

(Embodiment 8)

Figure 11:
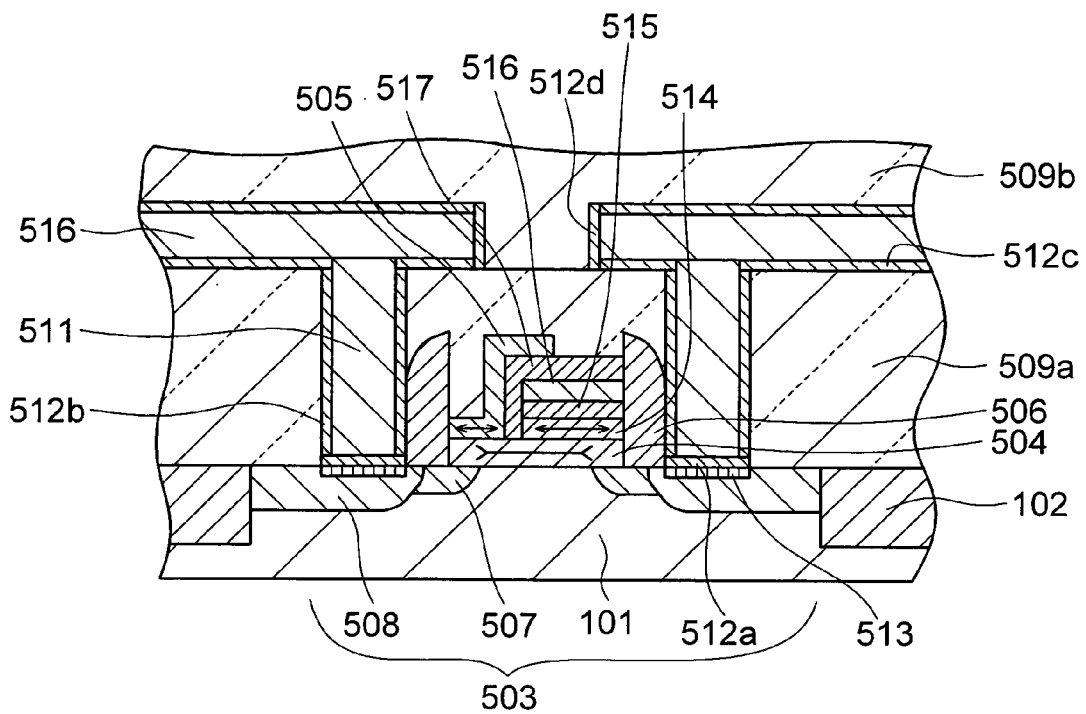
FIG. 11 is a sectional view showing a main portion of a semiconductor memory device according to a seventh embodiment of the present invention.

FIG. 11 is a sectional view of the semiconductor device according to an eighth embodiment of the present invention. The semiconductor device of the embodiment constitutes a non-volatile semiconductor memory device and includes, as shown in FIG. 11, device separation layer 102 of, for example, silicon oxide layer formed in the surface of P-type silicon substrate 101 and device formation area 503. A floating gate type N-channel transistor is formed in the device formation area 503.

The semiconductor device of the embodiment 8 is different from the non-volatile semiconductor memory device of the embodiment 6 in that the semiconductor device of the embodiment 8 includes a memory gate 516 formed on the laminated structure of the tunnel gate insulating layer 504, the floating gate 514 and the inter-gate insulating layer 515, a inter-gate insulating layer 517 formed to cover them and a control gate 505 formed on the inter-gate insulating layer 517. In this manner, an area containing the memory gate and an area containing the control gate are formed over the common insulating layers and both the areas are separated by the insulating layer such as the inter-gate insulating layer. The floating gate 514 and the control gate 505 are formed of polycrystalline silicon layer and the inter-gate insulating layer 515 is made of silicon oxide, silicon nitride, silicon oxynitride or the like. The control gate may be formed of metal thin film layer of tungsten, molybdenum or the like or metal compound of tungsten nitride or the like or metal silicide layer of tungsten silicide or the like or laminated structure thereof.

The tunnel gate insulating layer 504 of the embodiment is mainly made of SiON and is in the compressed strain state. It is preferable that the strain amount of the SiON tunnel gate insulating layer is smaller than or equal to about 1.5% as described in the embodiment 1 when the withstandable voltage characteristic and the peeling strength are considered. The SiON tunnel gate insulating layer is made to the compressed strain state by making the floating gate 514 or the control gate 505 or the memory gate 516 disposed over the SiON tunnel gate insulating layer to the tensile strain state, for example. Further, in order to make the floating gate, the control gate and the memory gate to the tensile strain state, the method of forming the gate electrode being in the tensile strain state described in the embodiment 2 or 3 may be applied upon formation of the floating gate, the control gate and the memory gate. Alternatively, the method described in the embodiment 4 may be used to make the SiON tunnel gate insulating layer itself to the compressed strain state. In this case, since the channel portion at the interface of the silicon substrate is made to the tensile strain state, not only reduction of the leakage current by the compressed strain of the tunnel gate insulating layer but also high-speed operation of the transistor by the tensile strain of the channel portion at the interface of the silicon substrate can be realized simultaneously for the N-channel transistor.

In the embodiment, the SiON layer is used as the tunnel insulating layer of the non-volatile semiconductor memory device, so that there can be provided the non-volatile semiconductor memory device having the thickness thinner than or equal to the lower limit of the $SiO_2$ tunnel insulating layer and the memory function preserved.

(Embodiment 9)

The embodiment 9 uses silicon nitride or silicon oxynitride as the floating gate 514 in the embodiment 8. The silicon nitride or silicon oxynitride is used to make the floating gate to the strain state, so that it is expected that the non-volatile semiconductor memory device having higher storage effect of electrons and smaller leakage current as compared with the case of the strainless state is obtained. Further, it is preferable that the strain amount of the floating gate is smaller than or equal to about 2% when the peeling strength is taken into consideration.

Further, the floating gate is made to the tensile strain state to thereby make both of the tunnel gate insulating layer under the floating gate and the inter-gate insulating layer on the floating gate to the compressed strain state as a result of its reaction. Accordingly, when the tunnel gate insulating layer or the inter-gate insulating layer is not required to be thinned, conventional silicon oxide may be used as constituent material of these insulating layers, while when thinning is required, the relative dielectric constant is larger than $SiO_2$ and accordingly the physical thickness is thicker than or equal to the equivalent oxide thickness and the DT leakage current can be reduced. In addition, the band gap is increased in the compressed strain state and SiON layer which can also reduce the FN leakage current is used for the tunnel gate insulating layer or the inter-gate insulating layer to thereby attain the non-volatile semiconductor memory device with higher reliability.

Further, in order to make the floating gate made of silicon nitride or silicon oxynitride to the tensile strain state, gas containing carbon atoms (C) as constituent element is caused to be contained upon formation of layer to thereby cause impurity such as carbon atoms to be contained into the floating gate. Thereafter, the impurity such as carbon atoms is removed by thermal treatment, so that the volume of the floating gate is contracted to thereby be the tensile strain state.

(Embodiment 10)

Figure 12:
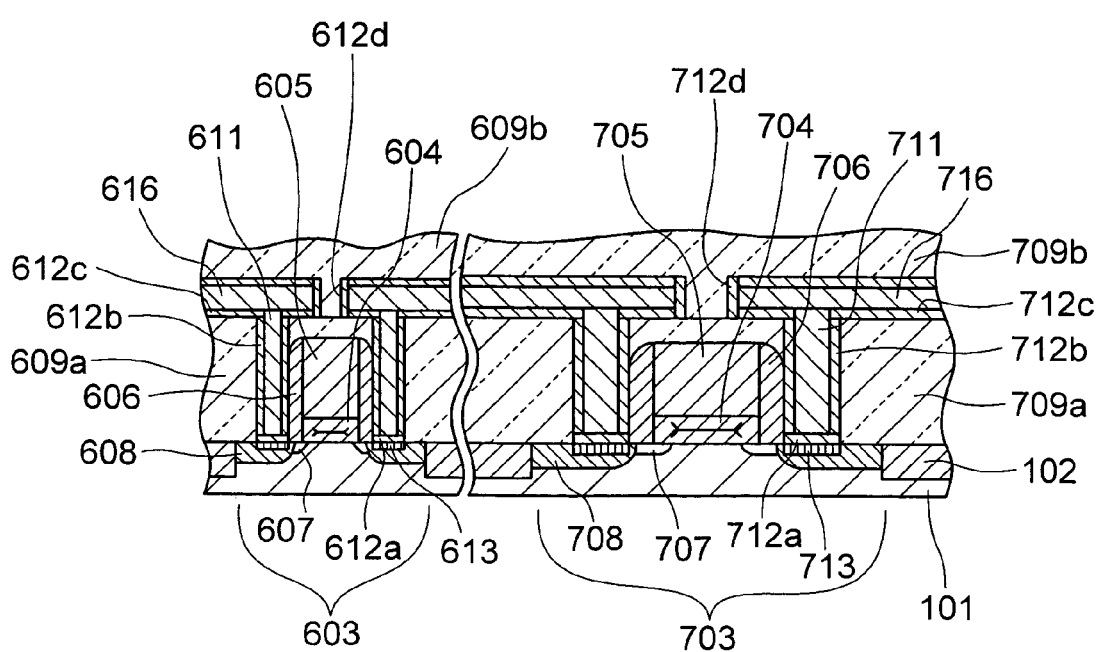
FIG. 12 is a sectional view showing a main portion of a semiconductor device according to a ninth embodiment of the present invention and taken along A–A' of FIG. 13.
Figure 13:
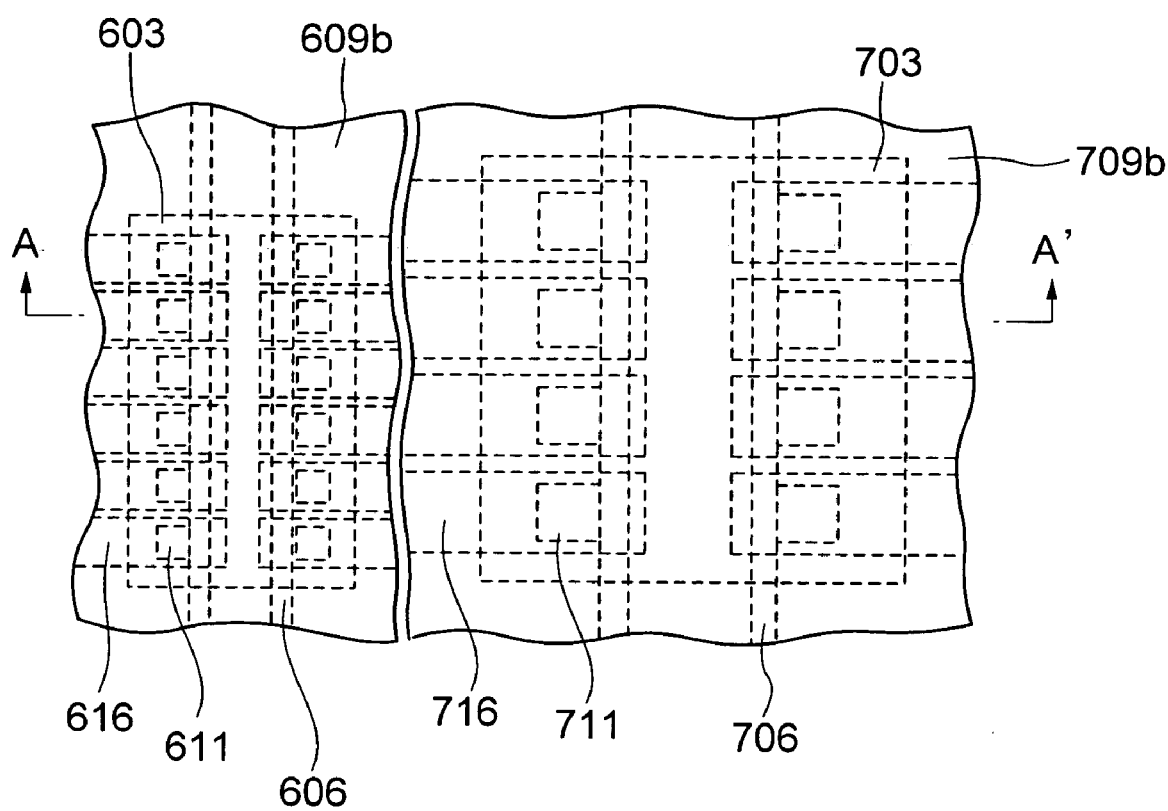
FIG. 13 is a plan view showing the main portion of the semiconductor device according to the ninth embodiment of the present invention.

In the embodiment 10 of the present invention, a system LSI having logical circuits and memories mixed therein is considered. For simplification of description, the mixed circuit of a MOS transistor requiring the high-speed operation and a MOS transistor requiring the low power consumption is described by way of example. FIG. 12 is a sectional view showing a main portion of the semiconductor device of the embodiment and taken along A–A' of FIG. 13.

The MOS transistor is constituted by single-channel MOS transistor, C-MOS transistor or BiCMOS transistor. In the embodiment, for simplification of description, the semiconductor device constituted by N-channel MOS transistor having source and drain diffusion layers of LDD structure is described.

The semiconductor device of the embodiment includes, as shown in FIG. 12, device separation layer 102 of, for example, silicon oxide layer formed in the surface of a P-type silicon substrate 101, formation area 603 for MOS transistor requiring the high-speed operation and formation area 703 for MOS transistor requiring the low-power consumption. N-channel MOS transistors are formed in the formation areas 603 and 703.

The MOS transistor formed in the device formation area 603 includes a gate insulating layer 604 and a gate electrode 605. A side wall 606 of, for example, silicon oxide is formed on the side of the gate electrode 605. The gate insulating layer 604 is mainly made of SiON and the gate electrode 605 is constituted of, for example, polycrystalline silicon layer, metal thin film layer, metal silicide layer or laminated structure thereof. Particularly, when it is considered that the mutual diffusion at the interface between the gate electrode and the SiON is suppressed and the resistance of the gate electrode is reduced for the purpose of the high-speed operation, it is preferable that thin barrier metal such as TiN and TaN having good adhesive characteristic to the SiON is formed on the SiON layer and metal thin film layer of W, Mo, Ta, Ti or the like is formed on the thin barrier metal. In this case, when it is considered that the reduction of the resistance is important, W or Mo is used. Further, in this either case, W is excellent in the thermal stability at a high melting point and Mo is excellent in the flatness of the layer. Moreover, when the adhesive characteristic to the barrier metal is regarded as important, TiN is formed on the SiON and Ti is formed thereon or TaN is formed on the SiON and Ta is formed thereon. Further, in this either case, the structure using TiN and Ti is more excellent in the adhesive characteristic to the SiON and the structure using TaN and Ta is more excellent in the barrier characteristic for diffusion or the like.

The MOS transistor includes, as source and drain diffusion layers, an extension area 607 formed in the self-aligned manner to the gate electrode 605 and a contact area 608 formed in the self-aligned manner to the device separation layer 102 and the gate electrode 605.

The transistor formed in the device formation area 703 includes laminated structure of gate insulating layer 704 and gate electrode 705. A side wall 706 of, for example, silicon oxide is formed on the side of the gate electrode 705. The gate insulating layer 704 is mainly made of SiON and the gate electrode 705 is constituted of, for example, polycrystalline silicon layer, metal thin film layer, metal silicide layer or laminated structure thereof. Particularly, when it is considered that the mutual diffusion at the interface between the gate electrode and the SiON is suppressed and the resistance of the gate electrode is reduced for the purpose of the high-speed operation, it is preferable that thin barrier metal such as TiN and TaN having good adhesive characteristic to the SiON is formed on the SiON layer and metal thin film layer of W, Mo, Ta, Ti or the like is formed on the thin barrier metal. In this case, when it is considered that the reduction of the resistance is important, W or Mo is used. Further, in this either case, W is excellent in the thermal stability at a high melting point and Mo is excellent in the flatness of the layer. Moreover, when the adhesive characteristic to the barrier metal is regarded as important, TiN is formed on the SiON and Ti is formed thereon or TaN is formed on the SiON and Ta is formed thereon. Further, in this either case, the structure using TiN and Ti is more excellent in the adhesive characteristic to the SiON and the structure using TaN and Ta is more excellent in the barrier characteristic for diffusion or the like.

The transistor includes, as source and drain diffusion layers, an extension area 707 formed in the self-aligned manner to the gate electrode 705 and a contact area 708 formed in the self-aligned manner to the device separation layer 102 and the gate electrode 705.

Interlayer insulating layers 609a, 609b, 709a and 709b are formed in the surface of the semiconductor device. Contact holes reaching the contact areas 608 and 708 of the source and drain diffusion layers are formed in the interlayer insulating layers 609a, 609b, 709a and 709b and contact plugs 611 and 711 are formed therein. The contact plugs are made of W, Al, poly-Si or the like. However, in order to attain the adhesive characteristic to the interface of the silicon substrate and prevention of the mutual diffusion at the interface, it is preferable that the contact plugs are formed after contact layers 613 and 713 are formed at the interface of the contact areas, barrier metal portions 612a and 712a are formed on the contact layers and barrier metal portions 612b and 712b are formed at the interface of the interlayer insulating layers. The contact layers 613 and 713 are made of $CoSi_2$, $TiSi_2$ or the like and the barrier metal portions are made of TiN, TaN or the like.

Wiring layers 614 and 714 are formed on the contact plugs 611 and 711, although it is preferable that the wiring layers are formed after barrier metal portions 612c, 612d, 712c and 712d are formed for the purpose of the adhesive characteristic to the interlayer insulating layers 609a, 609b, 709a and 709b and prevention of the mutual diffusion. The wiring layers are made of Al, Cu or the like and the barrier metal portions 612c, 612d, 712c and 712d are made of TiN, TaN or the like. Only one layer is shown as the wiring layers in FIG. 12, although a further wiring layer or a plurality of wiring layers may be formed thereon and viaplugs made of W, Cu, Al or the like may be connected between the wiring layers.

In the MOS transistor using the SiON gate insulating layer, it is preferable that the insulating layer is in the compressed strain state from the point of view of the leakage current, although the degree of strain of the MOS transistor requiring the high-speed operation and the MOS transistor requiring the low power consumption may be different depending on the permissible value of the leakage current.

For example, when parameters of the node (the year 2006) in case where the half-pitch of the MPU described in the international semiconductor load map is 70 nm is used, it is understood that the compressed strain of the MOS transistor requiring the high-speed operation is larger than or equal to 1.3% and for the MOS transistor requiring low power consumption, compressed strain or tensile strain smaller than 0.7% is necessary in order to satisfy the permissible value of the leakage current as described in the embodiment 1. (The MOS transistor requiring the high-speed operation and the MOS transistor requiring the low power consumption are regarded as (a) high-performance transistor (HP) and (b) low-operating power transistor (LOP), respectively.)

Further, it is preferable that the strain amount of the SiON gate insulating layer is smaller than or equal to about 1.5% as described in the embodiment 1 when the withstandable voltage characteristic and the peeling strength are taken into consideration. Accordingly, for the parameters of the calculation of FIGS. 5A to 5C, for example, when the withstandable voltage characteristic and the peeling strength are taken into consideration in addition to suppression of the leakage current to the permissible value or less, it is preferable that the MOS transistor requiring the high-speed operation has the compressed strain of 1.3 to 1.5% and the MOS transistor requiring the low power consumption has the compressed strain smaller than or equal to about 1.5% or the tensile strain smaller than or equal to 0.7%.

According to the embodiments, it is easy to manufacture a high-functional and high-reliable system LSI having any logical circuits and memories mixed therein by preponderantly considering control of strain in the circuit in which the strain control is particularly important.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device forming an electric field effect type transistor including a semiconductor substrate, a gate insulating layer formed on said semiconductor substrate and a gate electrode formed on said gate insulating layer, said gate insulating layer being mainly made of silicon oxynitride (SiON) and having a compression strain state as its strain state, a strain state of said gate electrode being a tensile strain state.

2. A semiconductor device including a plurality of electric field effect type transistors each having a semiconductor substrate, a gate insulating layer formed on said semiconductor substrate and a gate electrode formed on said gate insulating layer, said gate insulating layer being made of silicon oxynitride and having a compression strain state as its strain state, a strain state of said gate electrode being a tensile strain state.

3. A semiconductor device including a plurality of electric field effect type transistors each having a semiconductor substrate, a gate insulating layer formed on said semiconductor substrate and a gate electrode formed on said gate insulating layer, wherein a first electric field effect type transistor includes gate insulating layer which is mainly made of silicon oxynitride and is mainly in a compressed strain state and a second electric field effect type transistor includes gate insulating layer which is mainly made of silicon oxide, a strain state of said gate electrode is a tensile strain state.

4. A semiconductor device according to claim 3, wherein said first electric field effect type transistor constitutes a calculation unit or a memory unit and said second electric field effect type transistor constitutes an I/O unit.

5. A semiconductor device including a semiconductor substrate, a tunnel gate insulating layer formed on said semiconductor substrate, a floating gate formed on said tunnel gate insulating layer, an inter-gate insulating layer formed on said floating gate and a control gate formed on said inter-gate insulating layer, said tunnel gate insulating layer being made of silicon oxynitride, a strain state of said tunnel gate insulating layer being a compressed strain state, a strain state of said floating gate being a tensile strain state.

6. A semiconductor device including a semiconductor substrate, a tunnel gate insulating layer formed on said semiconductor substrate, a floating gate formed on said tunnel gate insulating layer, an inter-gate insulating layer formed on said floating gate, a multi-layer film having a memory gate formed on said inter-gate insulating layer, a gate insulating layer having an area covering said multi-layer film and a control gate having an area covering said gate insulating layer, said tunnel gate insulating layer being mainly made of silicon oxynitride, a strain state of said tunnel insulating layer being mainly in a compressed strain state, a strain state of said floating gate or said control gate is a tensile strain state.

7. A semiconductor device forming an electric field effect type transistor including a semiconductor substrate, a gate insulating layer formed on said semiconductor substrate and a gate electrode formed on said gate insulating layer, said gate insulating layer being mainly made of silicon oxynitride (SiON) wherein said semiconductor device includes means for reducing leakage current in the gate insulating layer, said means comprising forming the silicon oxynitride to have a compression strain state as its strain state, a strain state of said gate eletrode being a tensile strain state.

8. A semiconductor device including a plurality of electric field effect type transistors each having a semiconductor substrate, a gate insulating layer formed on said semiconductor substrate and a gate electrode formed on said gate insulating layer, said gate insulating layer being made of silicon oxynitride, wherein said semiconductor device includes means for reducing leakage current in the gate insulating layer, said means comprising forming the silicon oxynitride to have a compression strain state as its strain state, a strain state of said gate electrode being a tensile strain state.

* * * * *